(12) United States Patent
Kostelnik et al.

(10) Patent No.: US 9,748,514 B2
(45) Date of Patent: Aug. 29, 2017

(54) METHOD FOR PRODUCING AN OPTICAL MODULE

(71) Applicant: Würth Elektronik Gmbh & Co. KG, Niedernhall (DE)

(72) Inventors: Jan Kostelnik, Kirchberg (DE); Jürgen Wolf, Kupferzell (DE)

(73) Assignee: Würth Elektronik Gmbh & Co. KG, Niedernhall (DE)

( * ) Notice: Subject to any disclaimer, the term of this patent is extended or adjusted under 35 U.S.C. 154(b) by 0 days.

(21) Appl. No.: 14/896,314

(22) PCT Filed: Jun. 6, 2014

(86) PCT No.: PCT/EP2014/061788
§ 371 (c)(1),
(2) Date: Dec. 4, 2015

(87) PCT Pub. No.: WO2014/195444
PCT Pub. Date: Dec. 11, 2014

(65) Prior Publication Data
US 2016/0126491 A1    May 5, 2016

(30) Foreign Application Priority Data
Jun. 7, 2013  (DE) .................. 10 2013 210 668

(51) Int. Cl.
*H01L 51/00*  (2006.01)
*H01L 51/52*  (2006.01)
(Continued)

(52) U.S. Cl.
CPC .......... *H01L 51/5237* (2013.01); *H01L 24/19* (2013.01); *H01L 31/0203* (2013.01);
(Continued)

(58) Field of Classification Search
CPC ... H01L 2924/12044; H01L 2251/5369; H01L 2933/005; H01L 31/0203; H01L 31/048; H01L 31/05; H01L 31/1884; H01L 51/524
See application file for complete search history.

(56) References Cited

U.S. PATENT DOCUMENTS 5,866,949 A *  2/1999  Schueller ............ H01L 23/3121
                                            257/678
6,372,608 B1 * 4/2002  Shimoda ............. G02F 1/13454
                                          257/E21.567
(Continued)

OTHER PUBLICATIONS

Written Opinion, PCT/EP2014/061788, Dec. 17, 2015, 8 Pages.
(Continued)

*Primary Examiner* — Jaehwan Oh
(74) *Attorney, Agent, or Firm* — Cesari & Reed, LLP; R. Michael Reed

(57) ABSTRACT

The invention relates to a method for producing an optical module, comprising the following steps: a) providing a chip having an optical element integrated in the chip, wherein the optical element bas a first electrode and a second electrode, and wherein the chip has a first connection contact for the first electrode and a second connection contact for the second electrode, such that an operating voltage for the optical element can be applied between the first connection contact and the second connection contact, and wherein the chip has an optically active side, which is designed to emit and/or to receive radiation; b) connecting the chip to a film, such that the film completely covers the optically active side of the chip, wherein the film is a film made from acrylate, polyarylate, or polyurethane, wherein the film, at least in the region located above the optically active side, is transparent to radiation which. when operating voltage is applied, can be emitted or received by the optical element; c) contacting the
(Continued)

first connection contact of the chip by means of a conducting track arranged on the film and contacting the second connection contact by means of an additional conducting track.

25 Claims, 6 Drawing Sheets

(51) Int. Cl.
| | |
|---|---|
| H01L 31/02 | (2006.01) |
| H01L 31/0203 | (2014.01) |
| H01L 31/048 | (2014.01) |
| H01L 33/56 | (2010.01) |
| H01L 33/62 | (2010.01) |
| H01L 23/00 | (2006.01) |
| H05K 1/02 | (2006.01) |
| H05K 1/14 | (2006.01) |
| H05K 1/18 | (2006.01) |
| H01L 31/05 | (2014.01) |
| H01L 31/18 | (2006.01) |
| H01L 51/56 | (2006.01) |
| H05K 3/46 | (2006.01) |

(52) U.S. Cl.
CPC .. *H01L 31/02005* (2013.01); *H01L 31/02008* (2013.01); *H01L 31/048* (2013.01); *H01L 31/05* (2013.01); *H01L 31/1884* (2013.01); *H01L 33/56* (2013.01); *H01L 33/62* (2013.01); *H01L 51/0022* (2013.01); *H01L 51/5203* (2013.01); *H01L 51/56* (2013.01); *H05K 1/0274* (2013.01); *H05K 1/144* (2013.01); *H05K 1/185* (2013.01); *H01L 51/524* (2013.01); *H01L 2251/5369* (2013.01); *H01L 2924/12044* (2013.01); *H01L 2933/005* (2013.01); *H01L 2933/0033* (2013.01); *H01L 2933/0066* (2013.01); *H05K 3/4644* (2013.01); *H05K 2201/0108* (2013.01); *H05K 2201/10106* (2013.01); *H05K 2201/10121* (2013.01); *Y02E 10/50* (2013.01)

(56) References Cited

U.S. PATENT DOCUMENTS

| | | | | |
|---|---|---|---|---|
| 7,622,367 | B1* | 11/2009 | Nuzzo | B82Y 10/00 |
| | | | | 257/E21.122 |
| 8,933,473 | B1* | 1/2015 | Dubin | H01L 25/167 |
| | | | | 257/79 |
| 2007/0104917 | A1* | 5/2007 | Krug | B32B 3/266 |
| | | | | 428/43 |
| 2009/0057875 | A1* | 3/2009 | Aoki | H01L 23/49855 |
| | | | | 257/702 |
| 2009/0065590 | A1* | 3/2009 | Aoki | G06K 19/07749 |
| | | | | 235/492 |
| 2009/0093088 | A1* | 4/2009 | Ano | H01L 21/56 |
| | | | | 438/114 |
| 2009/0250106 | A1* | 10/2009 | Hayashi | H01L 31/022425 |
| | | | | 136/256 |
| 2010/0072500 | A1* | 3/2010 | Herrmann | B29C 43/021 |
| | | | | 257/98 |
| 2010/0133564 | A1* | 6/2010 | Herrmann | H01L 21/6835 |
| | | | | 257/98 |
| 2012/0319152 | A1* | 12/2012 | Park | H01L 33/62 |
| | | | | 257/98 |
| 2015/0041845 | A1* | 2/2015 | Schwarz | H01L 33/54 |
| | | | | 257/99 |

OTHER PUBLICATIONS

Preliminary Report on Patentability, PCT/EP2014/061788, Dec. 17, 2015, 2 Pages.
International Search Report, PCT/EP2014/061788, Sep. 22, 2014, 6 Pages.

* cited by examiner

METHOD FOR PRODUCING AN OPTICAL MODULE

CROSS-REFERENCE TO RELATED APPLICATION(S)

This application is a national phase application of and claims priority to PCT Application No. PCT/EP2014/061788 filed on Jun. 6, 2014, which claims priority to German Patent Application No. 10 2013 210 668.8 filed on Jun. 7, 2013.

FIELD

The invention relates to a method for manufacturing an optical module with an optical element integrated in a chip integrated optical element, in particular a light-emitting optical element, such as a LED, EED, HCSELD, OLED or PLED and/or an optical sensor.

BACKGROUND

From DE 10 2007 007 847 A1, a light emitting device is disclosed and a method known for the preparation thereof. To prepare the device, the anode and cathode terminals of a LED are electrically contacted by wire bonding and a sealing resin is used.

From the OE 10 2007 044 446 A1, a flexible circuit is disclosed that has an array of known LEDs. Again, the LEDs can be contacted by wire bonding.

From DE 199 53 160 B4, an electrode structure for LEDs is known in which the electrodes may be arranged for the wire bonding in an edge region.

With LEDs, the emission of light is generally carried out by an upper transparent electrode. But this need not be necessarily so:

From the prior art, Edge Emitting Laser Diodes (EELS) are known per se, for example, from U.S. Pat. No. 5,105,430, in which the light is radiated laterally, as well as horizontal cavity surface-emitting laser diodes (HCSELD), cf. Appl. Phys. Lett. 84.4104 (2004); An InGaN-based horizontal-cavity surface-emitting laser diode.

From the time of registration of unpublished International Patent Application PCT/EP2012/059476, the contacting of an electrical component with an electrically conductive foil is disclosed, in particular a carrier film by low-temperature sintering of nanoparticles.

SUMMARY

An object of the present invention is therefore to provide methods for the manufacture of an optical module.

The object underlying the invention is solved by the features of claim 1. Embodiments of the invention are specified in the dependent claims.

An "optical module" is understood here as a device that can be used for lighting or that is designed as an optical transmitter or receiver for the purpose of signal transmission. The optical module may comprise one or more optical elements, in particular a matrix including optical elements wherein the optical elements can act as optical radiation sources and/or receivers.

A "chip" is here understood to mean an integrated circuit, particularly an integrated semiconductor circuit. An optical element can be integrated in such a chip.

According to embodiments of the invention, the production of an optical module is carried out, by providing a first chip with at least one integrated optical element. The optical element has a first electrode and a second electrode of the chip and has respective first and second terminal contacts for the electrodes of the integrated optical element. By applying an operating voltage between the terminal contacts, the optical element is activated to emit and/or receive radiation depending on the embodiment. For this purpose, the optical element has an optically active side from which the radiation is emitted or received.

Depending on the embodiment, for example, the first electrode may be formed transparent or partially transparent, to form the optical active side of the chip. However, it is also possible that an edge of the chip forms the optically active side of the chip and that light is radiated from one of the group consisting of radiating elements, such as, for example, an EED, as may be the case.

At least one such chip is then joined to a film, so that the film completely covers at least the optically active side of the chip. The connection between the chip and the foil can be done for example by gluing, laminating and/or pressing.

When the film is acrylate, polyacrylate or polyurethane, the film can be transparent to radiation at least in the region which is located above the optically active side, which radiation can be emitted by or be received by the optical element at the operating voltage. In particular, the film may be totally transparent or may have transparent windows. In the latter case, a transparent window of the film may be positioned prior to the connection of the chip on the optically active side of the chip, for example by laminating, gluing or pressing.

According to one embodiment of the invention, the foil is a thin epoxy film.

According to one embodiment of the invention, a thin and flexible glass film is laminated to the foil.

The film is then electrically connected to the connector contact by means disposed on an upper side or rear side of the foil conductor, wherein the means may include a conductor track applied, for example by printing technology onto the film.

Embodiments of the invention are particularly advantageous, since the heretofore required general wire bonding for contacting of the electrodes of the optical element can be omitted due to the use of the film. Of particular further advantage is that the connection of the chip with the film and the contacting of the terminal contacts can be done inline, for example, in a so-called reel-to-reel production.

According to one embodiment of the invention, the compound of the chips with the film is carried out by pressing, so that the film covers over the entire surface including the top side of the chip and the edge of the chip. Such pressing is due to the plastic properties of the film used, such as acrylate, polyarylate or polyurethane. Particularly preferred is the use of cold deformable arylate because then a substantial heating of the chips is not required for the compound having the film.

According to one embodiment of the invention, a hole in the film is produced by the connection of the chip with the film, which extends from the top of the film to the first connection contact. Subsequently, an electrical connection with the first contact pad may be formed through the hole. This can be done, after the production of the hole, by the application of conductive ink to the film, for example by a printing process such as inkjet printing or aerosol jet printing. The printed conductor can be applied to the film as well as the hole with the conductive ink filling in the hole order to connect the terminal contact through the hole to the interconnect. Aerosol Jet printing is known from the state of the art. See for example WO 20101089081 A1.

According to one embodiment of the invention, the hole is produced by a laser or plasma impingement of the film, preferably after the chip has been connected to the film, so that subsequent accurate alignment of the hole in the positioning of the film with respect to the connection contact is not necessary.

According to one embodiment of the invention, the optically effective parts can include the first electrode, which is at least partially transparent. The first electrode can be formed by intersecting conductor tracks, wherein the first terminal contact is arranged in an edge region of the top of the chip, in particular in an edge region of the first electrode, or on one of the edges of the chip, to minimize the radiation efficiency due to the first contact pad and its losing contact.

According to one embodiment of the invention, the contacting of the first, and depending on the design, can also occur with the second connection contacts using conductor tracks of the film by flip-chip mounting.

According to one embodiment of the invention, at least the first terminal contact may be formed through low-temperature sintering of nanoparticles, which may be applied to the first terminal contact and/or the film. This embodiment is particularly advantageous in combination with the use of cold deformable acrylate, because overall the temperature stress on the chips is then minimized in the production.

According to one embodiment of the invention, a multilayer Printed Circuit Board (PCB) is first produced, which contains one or more electrical and/or electronic components, and an interconnection of these components. The multilayer PCB may already contain one or more of the chips with the integrated optical element. In this case, the multilayer PCB is sealed at the top by application of the film. Alternatively, the chip is first connected with the film, and then then the film with the chip is applied to the top of the multilayer PCB, for example, by laminating the multilayer PCB with the film.

According to one embodiment of the invention, two different multilayer PCSs are prepared by this process, in which the one or more optical elements in the respective multilayer PCS provide for an optical signal transmission with galvanic isolation between the multilayer PCBs.

According to one embodiment of the invention, the foil is a decorative layer, which is particularly advantageous for the production of a lighting fixture, for example, for integration into a piece of furniture.

According to one embodiment of the invention, the optical element is a solar cell, which is designed for photo voltaic production of electricity. According to this embodiment of the invention therefore a solar panel is produced for generating electricity.

According to one embodiment of the invention, the optical sensor is a sensor for the reception of IR or UV radiation or other radiation in the visible or non-visible wavelength range.

According to one embodiment of the invention, the optical sensor for a wireless transfer of energy is adapted in particular for power transmission by means of electromagnetic waves, in particular for power transmission by means of laser radiation. Particularly preferably, the energy transfer takes place by means of electromagnetic waves, particularly in the gigahertz or terahertz range, to charge an energy storage device, such as a rechargeable electric battery of an electronic device. The electronic device may be, for example, a telecommunications device such as a smartphone or a tablet computer, or a medical device, in particular for detecting a medical parameter as act as a portable blood pressure monitor. According to the invention, the electric battery of the electronic device, which serves for the energy supply, can be charged by means of the wireless power transfer through the optical sensor.

BRIEF DESCRIPTION OF THE DRAWINGS

In addition, embodiments of the invention are shown with reference to the following drawings.

Elements of the following embodiments, which correspond to each other or are identical, are each marked with identical reference numerals.

DETAILED DESCRIPTION OF ILLUSTRATIVE EMBODIMENTS

Figure 1:
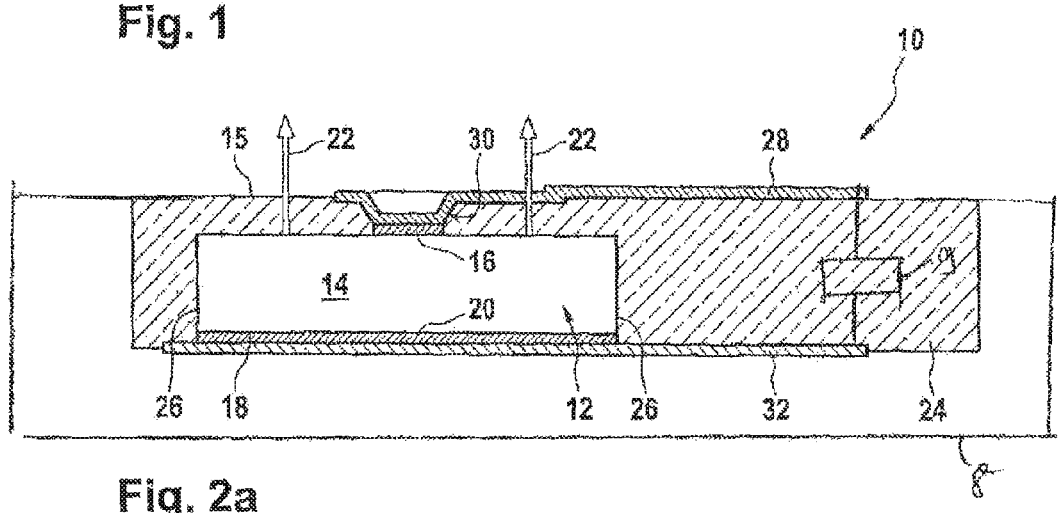
FIG. 1 is a sectional view of a first embodiment of an optical module.

FIG. 1 shows a sectional view of an embodiment of an optical module 10, which includes a chip 12, which has an integrated optical element 14, such as an LED. The optical element 14 includes a first electrode 15 having a first terminal contact 16 of the chip 12, and a second electrode 18 with a second terminal contact 20 of the chip 12.

In the embodiment considered here, the first electrode 15 is at least partially transparent, so that radiation can be emitted as indicated by the arrows 22 pointing upwards. The first terminal contact 16 is located approximately in the middle of the first electrode 15. In contrast, the second electrode 18 can be flat and not transparent and can be extensively connected to the second terminal contact 20.

Through the first electrode 15, the optically active side of the chip 12 is formed in the embodiment considered here.

The chip 12 is connected to a film 24 on the optically active side of the chip, such that the first electrode 15 and the edges 26 of the chip are completely covered.

The film 24 can be made of acrylate, polyarylate or polyurethane, wherein the polyurethane is unfoamed. Preferably, cold deformable acrylate is used.

The material of the film is chosen such that it is transparent to radiation, which is emitted from the optical element 14 in the direction of the arrow 22 when an operating voltage to the electrodes 15 and 18 is applied. In this case, the film may be transparent for this radiation, or a portion of the film can be formed to be transparent at least above the first electrode 15 to create a window for the passage of the radiation.

The sheet 24 has on its upper side a conductor track 28, which is electrically connected through a hole 30 in the film to the first terminal contact 16. On its rear side, the film 22 has a further conductor track 32, which contacts the second terminal contact 20.

For example, the conductor track 28 as well as the through-connection through the hole 30 can be formed by a printing process applied to the top of the film 24, whereas the conductor 32 can be made by a patterning technique, such as by coating the back side with copper and a subsequent etching step. Alternatively, the conductor 32 can be also printed.

Alternatively or in addition, the chip 12 includes an optical sensor for receiving electromagnetic radiation for wireless transfer of energy from an optical signal, for example, for triggering a switching operation. In particular, a solar cell may be in the chip 12 for generating electrical energy.

The optical module 10 may form an integral part of a device 8. The device 8 may be an electronic device such as a mobile telecommunication device or a mobile battery-operated medical device for sensing a biological parameter of a patient. For example, the device 8 can include a rechargeable battery 9, which may be electrically connected to the optical module 10, i.e. the chip 12, in order to recharge.

FIG. 2a-2d shows the corresponding steps of a manufacturing process. In the first step, which is illustrated in the FIG. 2a, the film 24 and the chip 12 are provided. This can be done for example by a reel-to-reel production, where the film is unwound 24 from a roller and synchronously therewith chips 12, which are one behind the other attached to a belt, are passed. The chip 12 that is exemplarily shown in the FIG. 2a will also be handled by a belt.

Figure 2A:
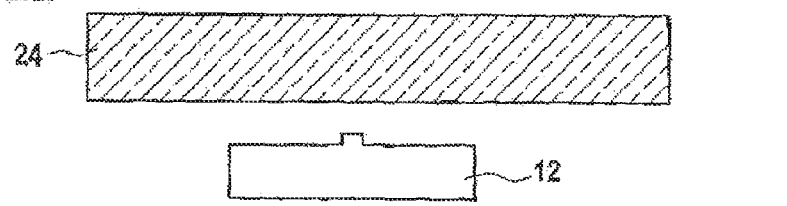
FIGS. 2a-2d, the method steps of an embodiment of an inventive method for producing the optical module according to FIG. 1.
Figure 2B:
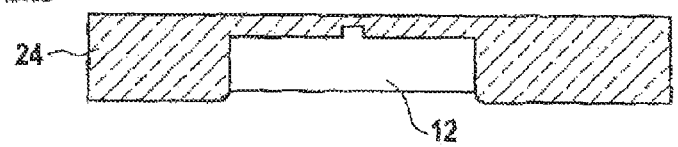

In the second step, which is illustrated in the FIG. 2b, the chip 12 is connected to the film 24 by pressing the chip 12 into the foil 24, whereby the film 24 is plastically deformed. This can for example be affected by applying the foil 24 to the chip 12 at a pressing roller.

Figure 2C:
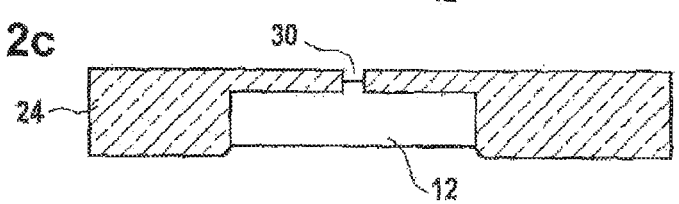

Subsequently, then in the third step, which is illustrated in the FIG. 2c, the hole 30 is made in the film 24, for example by applying a laser or plasma to the film 20 from above.

Figure 2D:
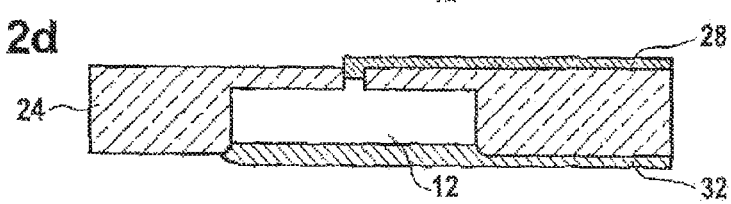

Subsequently, in the fourth step, which is shown in FIG. 2d, the conductor tracks 28 and 32 are applied, for example by inkjet printing or aerosol jet printing, so that the terminals 16 and 20 (see FIG. 1) thereby are contacted.

Figure 3:
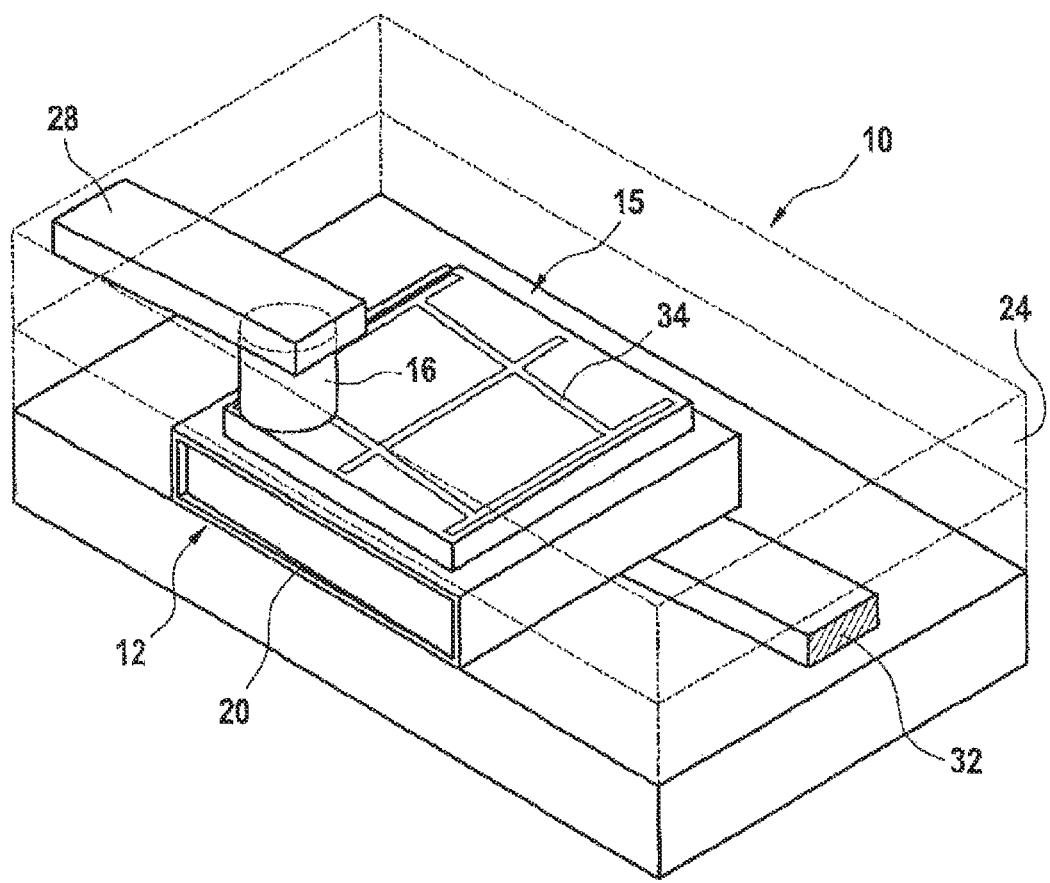
FIG. 3 is a perspective view of an embodiment of the optical module with the arrangement of the first connection contact in an edge region.

FIG. 3 shows a perspective view of an embodiment of an optical module 10, wherein the first electrode 15 is formed by intersecting strip conductors 34. The first terminal contact 16 is disposed in an edge region of the electrode 15 and thus also the chip 12 is arranged so that the conductor track 28 extends away from the electrode 15 and thus practically is not covered. This is particularly advantageous since the efficiency of the optical element 14 is increased.

Figure 4:
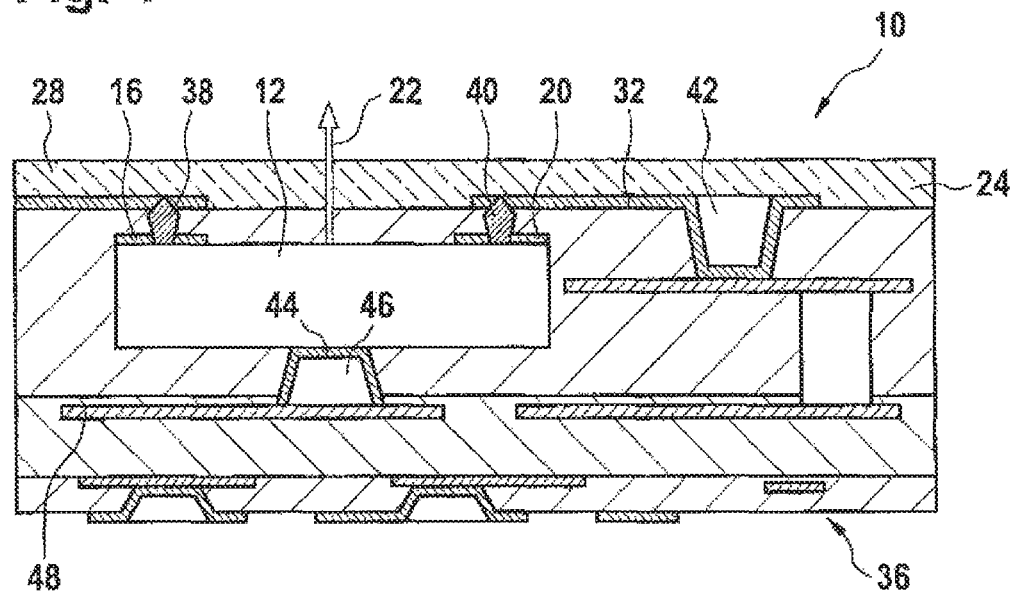
FIG. 4-FIG. 9 are sectional views of various embodiments of the optical module as a multilayer PCB.

FIG. 4 shows a sectional view of a multilayer PCB 36, which includes the chip 12 with the optical element 14. In contrast to the embodiments according to FIGS. 1 to 3, both terminals 16 and 20 of the optical element 14 are at the top thereof, i.e. arranged on the optically active side. The conductor tracks 28 and 32 are, for example, applied by printing in the embodiment considered here on the underside of the film 24. The terminals 16 and 20 are connected to the corresponding conductor tracks 28 and 32 by flip-chip contacting, on which corresponding contacts 38 and 40, that is, so-called solder bumps, may be provided.

The conductor tracks 28 and/or 32 of the film 24 may be connected to the underlying circuit structure of the multilayer PCB 36, for example, means of vias 42.

The preparation of the module 10 may here be made by first producing multilayer PCB 36 including the chip 12 and particularly the via 42. Separately, the conductor tracks 28 and 32 are applied, for example, by printing on the film 24. Finally, the conductor tracks 28 and 32 of the film 24 are applied, for example, laminated, glued or pressed, on top of the multilayer PCB 36 so that the contacts 38 or 40 form electrical connections to the conductor tracks 28 and 32, respectively.

An operating voltage can be applied via the connection contacts 16 and 20 to the optical element 14 the chip 12. In addition, the chip 12 can have a signal input 44, which is electrically connected, for example, through a via 46 to a conductor track 48 of the multilayer PCB 36. A switching signal can be received by the chip 12 via this conductor track 48, for example, for switching on and off of the optical element 14.

Figure 5:
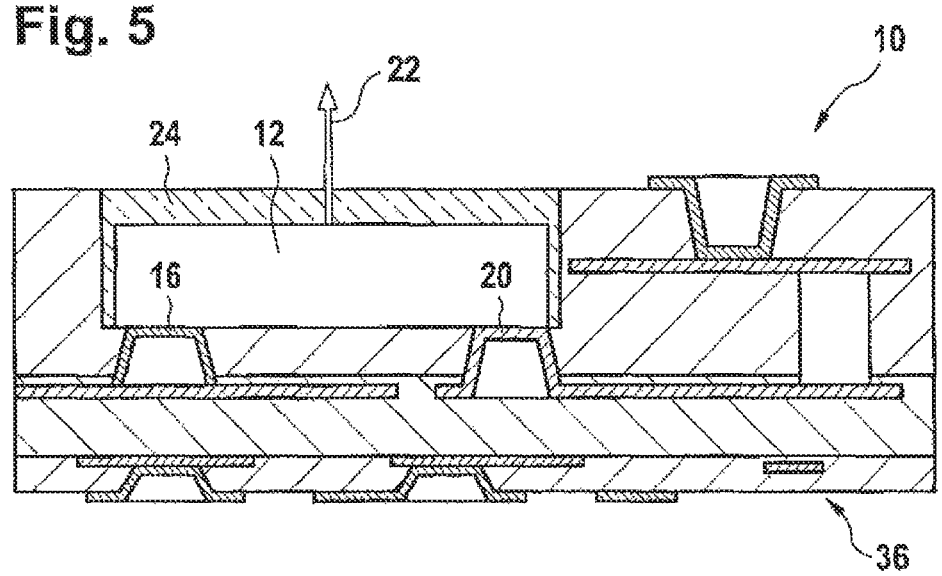

FIG. 5 shows a further embodiment of the multi-layer PCB 36, in which the connection contacts 16 and 20 are arranged on the underside the chip 12 and the film 24 is formed on the optically active side covering the top of the chip 12.

Figure 6:
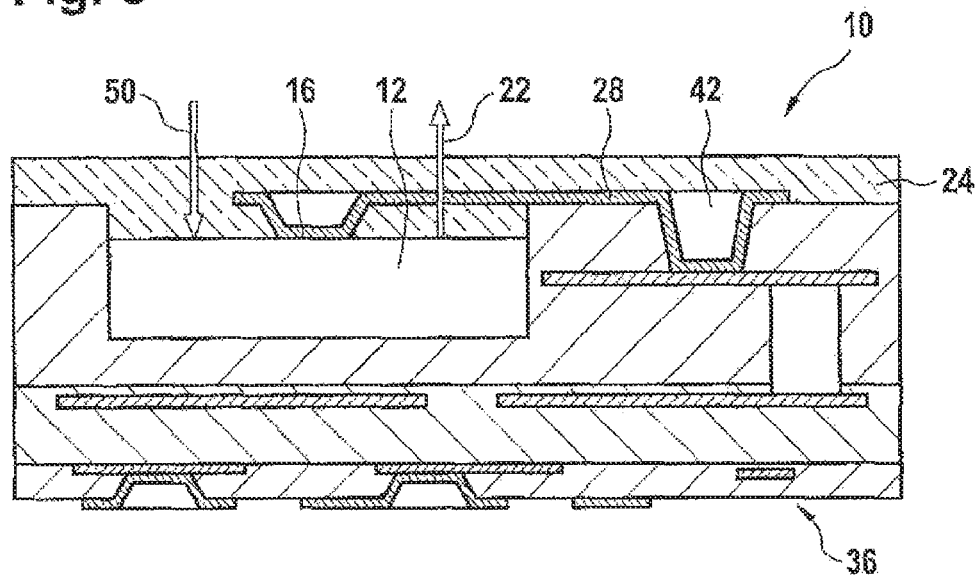

FIG. 6 shows another embodiment of the multilayer PCB 36. In this embodiment the terminal contact 16 is arranged centrally on the top side of the chip 12. The foil 24 has at its bottom, the conductor track 28, which contacts with the terminal contact 16 and the via 42 to the circuit structure of the multi-layer PCB 36. The preparation can be carried out so that first the multilayer PCB 36 is made with the chip 12 and then the film 24 is applied to the conductor track 28. The chip 12 can here be formed in the direction of arrow 50, both for delivering an optical signal in the direction of arrow 22 as well as to receive an optical signal.

According to one embodiment of the invention, the formation of an electrical connection between the connection contact 16 and the conductor 28 and / or between the connection contact 20 and the conductor 32 is carried out by low-temperature sintering.

For this example, nanoparticles, in particular of gold, silver, nickel or copper or an alloy of these metals, are located on the terminal contact 16 and/or the conductor track 28. The low-temperature sintering for connection of the terminal 16 to the conductor track 28 can be carried out as a "pressure-free" low-temperature sintering, wherein "no pressure" is understood herein to mean that the low-temperature sintering is not performed at the usually applied high pressures of for example 200 bar, but instead with a substantially lower pressure, such as that used for the lamination, that is at a pressure of 15-20 bar, for example.

For example, in a possible embodiment of FIG. 6, the film 24 is laminated on the PCB 36 and at the same time the non-pressure or low-temperature sintering is performed in order to connect the connection contact 16 to the conductor track 28.

Figure 7:
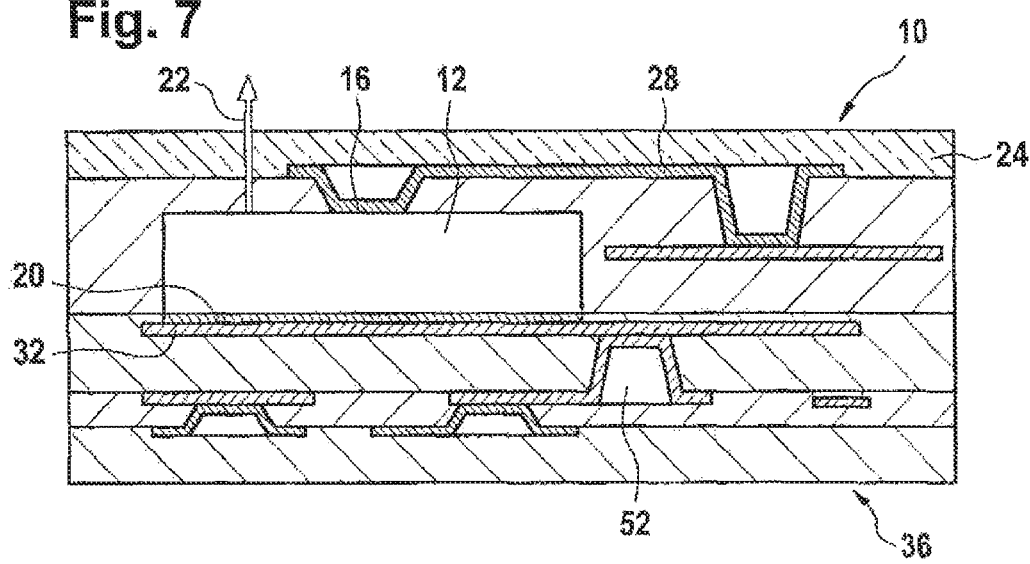

FIG. 7 shows a representation corresponding to an embodiment of FIG. 6, wherein the conductor is 32 realized in the multilayer PCB 36 and not on the film 24. The conductor track 32 is connected with further circuit structures of the multilayer PCB, for example, through a via 52. This embodiment is particularly advantageous when the foil 24 forms the outside of the optical module, and has, for example, a decorative visual appearance. Then, conductor tracks cannot be on the surface of the film 24.

Figure 8:
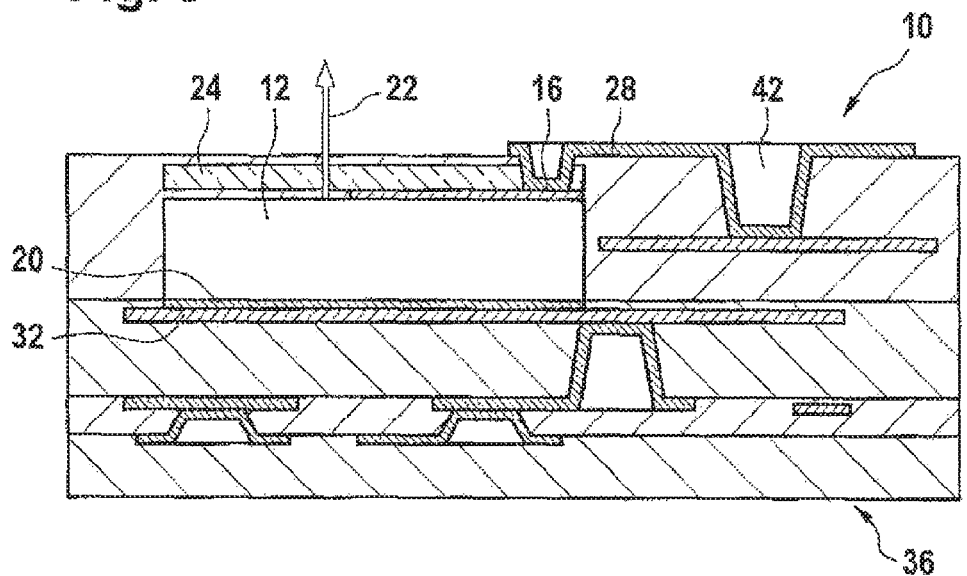

FIG. 8 shows a further embodiment of the multilayer PCB 36, wherein the terminal contact 16 of the chip 12 is disposed on the edge of the optically active side of the chip 12 and the conductor track 28 extends away from the optically active site, so that the conductor track 28 has no or only a small optical covering effect on the optically active side of the chip 12—similar to the embodiment according to FIG. 3.

Figure 9:
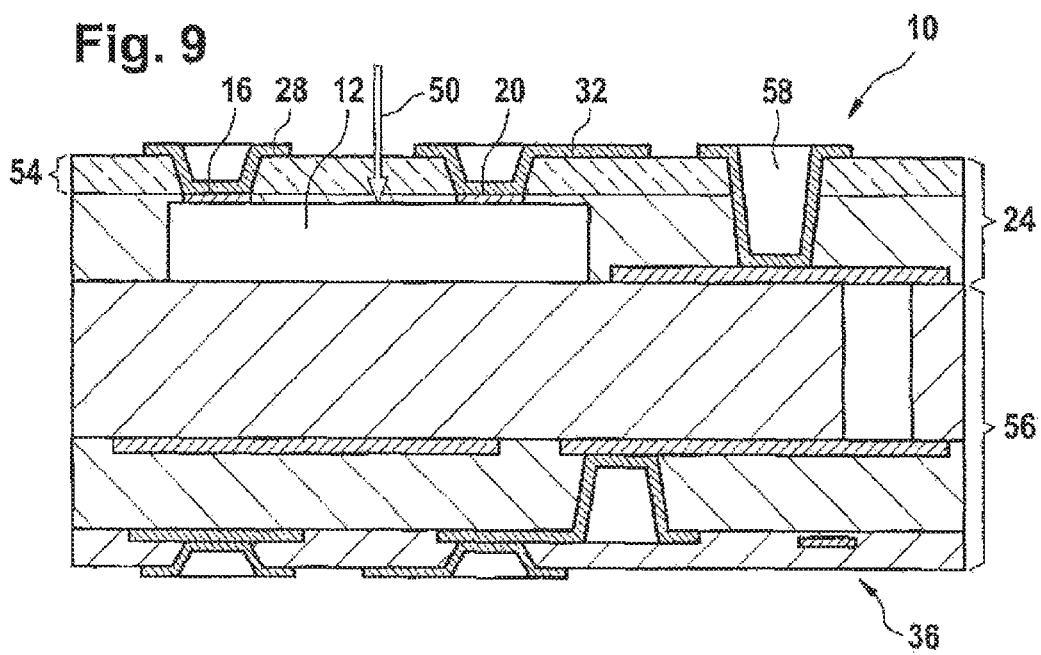

FIG. 9 shows a further embodiment of the PCB 36, in which case the film 24 is transparent only in the upper region

54. The production can be effected so that at first the layers in the lower portion 56 of the multilayer PCB 36 are produced. Separately, the film 24 is connected to the chip, for example by pressing, and the conductor tracks will be made in the film for contacting the terminals 16 and 20 of the chip 12, including the vias 58, which extend through the film. The film, thus prepared with the chip 12 and the conductor tracks, in particular the conductor tracks 28 and 32 for contacting the chip 12, is then applied on top of the portion 56 and is connected thereto, for example by gluing, lamination or pressing.

Figure 10:
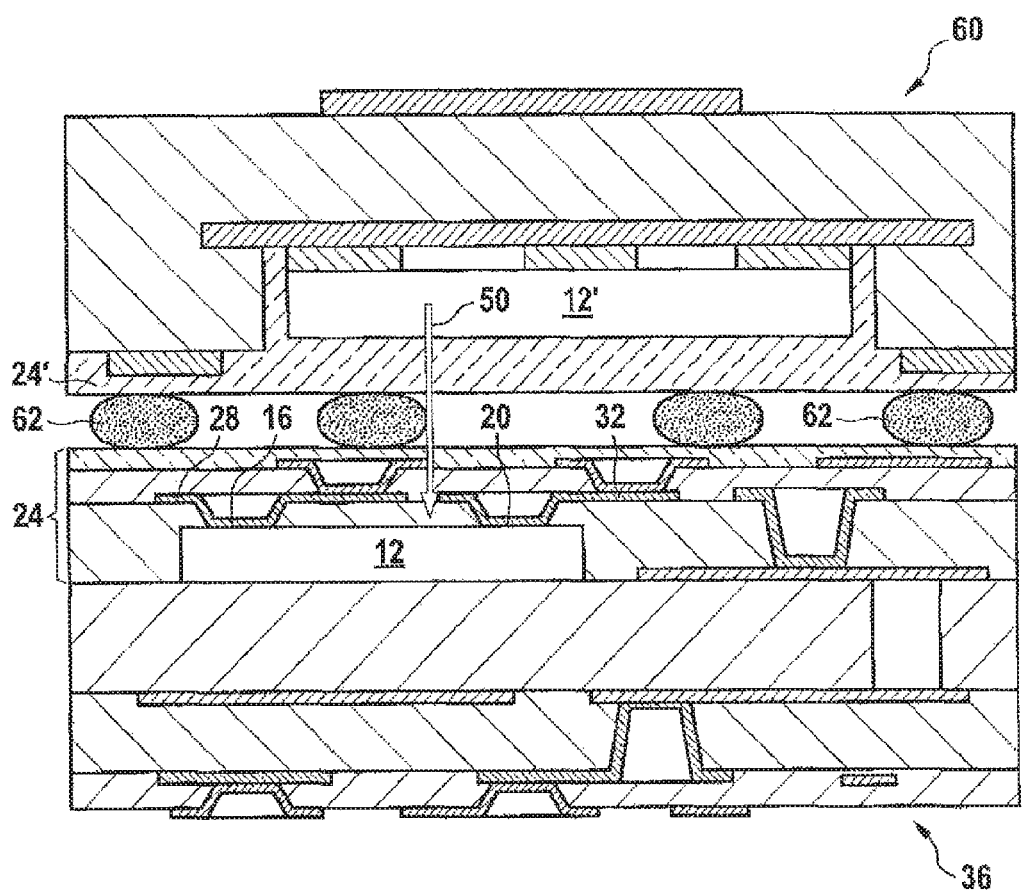
FIG. 10 is a sectional view of two opposing PCBs with optical coupling, according to the invention.

FIG. 10 shows another embodiment of the multilayer PCB 36 with an opposite further multilayer PCB 60, which may be formed also in accordance with an embodiment of the invention, in particular according to one of FIGS. 4 to 9. The chip 12' of the multilayer PCB 60 corresponds to the chip 12 and the multilayer PCB 36 and is here designed as an optical transmitter, whereas the chip 12 is formed as an optical receiver. The PCB 36 and 60 are connected to each other mechanically, but not electrically, for example by soldering or adhesive spots 62, so that an optical channel for the optical signal transmission from the PES 60 to the PCS 36 is realized through the films 24' and 24.

LIST OF REFERENCE NUMBERS

8 Device
9 Battery
10 Optical Module
12 Chip
14 Optical element
15 First electrode
16 First terminal contact
18 Second electrode
20 Second terminal contact
22 Arrow
24 Film
26 Edge
28 Interconnect
30 Hole
32 Interconnect
34 Interconnect
36 Multilayer PBC
38 Contact
40 Contact
42 Via
44 Signal Input
46 Via
48 Interconnect
50 Arrow
52 Via
54 Area
56 Area
58 Via
60 PCB

What is claimed is:

1. A method of manufacturing an optical module, the method comprising:
   providing a chip with an integrated optical element, wherein the optical element includes a first electrode and a second electrode, and wherein the chip has a first connection contact for the first electrode and a second connection contact for the second electrode, so that between the first and second connection contacts, an operating voltage for the optical element can be applied to emit and/or receive radiation through an optically active side;
   connecting the chip to a film, so that the film covers an entire surface of the optically active side of the chip, wherein the film is made of at least one of acrylate, polyarylate or polyurethane, wherein the film is transparent to radiation, which can be emitted or received by the optical element when the operating voltage is applied, at least in a region located above the optically active side; and
   contacting a first contact pad of the chip by means of the film arranged on a conductor track and containing the second connection contact of a further conductor track;
   wherein connecting the chip to the film comprises pressing the chip into the film so that the film covers an entire surface of a top side of the chip and edges of the chip.

2. The method of claim 1, wherein the film includes a cold-deformable acrylate.

3. The method according to claim 1, wherein the optically active side is on the top side of the chip, and the first connecting contact is located on top of the chip, the method further including producing a hole in the film extending from the top of the film to the first connection contact, and wherein the contacting of the first contact pad of the chip with the conductor track disposed on the film is provided through the hole.

4. The method of claim 3, wherein the hole is produced by impingement of the film with a laser or a plasma, and/or wherein the application of the conductor track on the film and the contacting of the conductor through the hole is applied by printing technology, especially by inkjet or aerosol jet printing, and/or the further conductor track is applied by printing, for example by inkjet printing or aerosol jet printing.

5. The method according to claim 3, wherein the hole is produced by impingement of the film with a laser or a plasma.

6. The method according to claim 1, wherein the optically active side includes the first electrode, wherein the first electrode of the optical element is formed by intersecting conductor tracks and the first connection contact is connected to at least one of the intersecting conductive tracks, wherein the first connection contact of the chip is arranged in an edge region of the top of the chip or on one of the edges.

7. The method according to claim 1, wherein the optical element includes a photovoltaic solar cell.

8. The method according to claim 1, wherein the optical element comprises at least one of light emitting diodes (LED), edge-emitting laser diodes (EED), horizontal-cavity surface-emitting laser diodes (HCSELD), organic light emitting diodes (OLED), polymer light emitting diodes (PLED), and an optical sensor.

9. The method of claim 8, wherein the optical sensor is a sensor for receiving radiation in a visible or invisible wavelength range, in particular for receiving radiation in an infrared (IR) or ultraviolet (UV) wavelength range.

10. The method according to claim 8, wherein the optical sensor is adapted to receive radiation from a wireless energy transmission, in particular from a power transmission by means of electromagnetic waves, particularly in the gigahertz or terahertz range, or from an energy transfer by means of laser, and wherein the sensor is electrically connected to an energy storage device for storing the energy received from the sensor.

11. The method of claim 10, wherein the energy storage device is a rechargeable electric battery, wherein the sensor is configured to convert the received energy into electric energy to charge the battery with the electrical energy.

12. The method according to claim 1, wherein at least one of the first connection contact and the second connection contact is connected to a conductor track arranged on the foil by a corresponding contact for a flip-chip mounting.

13. The method according to claim 1, wherein nanoparticles formed of a metal, in particular of gold, silver, nickel or copper, or of an alloy, may be used to form contacts between at least the first connection contact and the conductor tracks arranged on the foil through low-temperature sintering of the nanoparticles, wherein the nanoparticles are applied to at least one of the first connection contact and the conductor track of the film.

14. The method of claim 13, wherein the low-temperature sintering is carried out as a pressure-free low-temperature sintering, and the connection of the chips with the film is carried out by lamination, wherein the lamination is carried out simultaneously with the pressure-free low-temperature sintering.

15. The method of claim 14, wherein the pressure at the pressure-free low-temperature sintering is between 15 bar and 20 bar.

16. The method according to claim 1, wherein the film with the chip is applied face down on a multilayer PCS so that the conductor track arranged on the film contacts a conductor track of the multilayer PCB forming a connection.

17. The method of claim 16, wherein the film is laminated.

18. The method of claim 16, wherein a further multilayer PCB, which has been prepared by a method including:
    providing a second chip with an integrated optical element including a first electrode and a second electrode, the second chip including a first connection contact for the first electrode and a second connection contact for the second electrode such that application of the operating voltage between the first and second connection contacts causes the optical element to emit and/or receive radiation through an optically active side;
    connecting the second chip to a film so that the film covers an entire surface of the optically active side of the second chip, wherein the film is made of at least one of acrylate, polyarylate or polyurethane and is transparent to radiation, which can be emitted or received by the optical element when the operating voltage is applied, at least in a region located above the optically active side; and
    contacting a first contact pad of the second chip by means of a conductor track arranged on the film and contacting the second connection contact by a further conductor track; and
    the method further comprising:
        coupling the further multilayer PCB to the multilayer PCB, so that an optical signal transmission can be made between the optical element of the multilayer PCB and the optical element of the further multilayer PCB.

19. The method according to claim 1, wherein the film includes a decorative layer.

20. The method according to claim 1, wherein the optical module is a lighting unit, an optical transmitter and/or an optical receiver.

21. The method according to claim 1, wherein the first and second connecting contacts are arranged on the top side of the chip.

22. The method according to claim 1, wherein the film is an epoxy-film.

23. The method according to claim 1, wherein the film is a laminated flexible glass film.

24. The method according to claim 1, wherein the production of the optical module is carried out in a reel-to-reel production.

25. The method of claim 24, wherein the chip is provided on a tape, said tape carrying more of the chips consecutively secured to the tape and the film is provided on a roll, wherein the reel-to-reel manufacturing is performed so that the film is unwound from the roll and synchronously therewith the chips are also unwound from the tape, so that the chip is connected to the film by pressing the chip into the film using a pressure roller wherein the film is plastically deformed by passing the film and the tape with the chip to the pressure roller.

* * * * *